United States Patent [19]
Kuriyama

[11] Patent Number: 5,986,325
[45] Date of Patent: Nov. 16, 1999

[54] MICROWAVE INTEGRATED CIRCUIT DEVICE

[75] Inventor: Yasuhiko Kuriyama, Yokohama, Japan

[73] Assignee: Kabushiki Kaisha Toshiba, Kawasaki, Japan

[21] Appl. No.: 08/917,607

[22] Filed: Aug. 26, 1997

[30] Foreign Application Priority Data

Sep. 19, 1996 [JP] Japan .................................. 8-247873

[51] Int. Cl.⁶ ........................ H01L 29/417; H01L 29/73
[52] U.S. Cl. ........................ 257/587; 257/593; 257/664
[58] Field of Search .................................. 257/275, 277, 257/587, 592, 593, 664; 333/247

[56] References Cited

U.S. PATENT DOCUMENTS 5,384,486  1/1995  Konno .................................... 257/275

FOREIGN PATENT DOCUMENTS 8-148505  6/1996  Japan .

OTHER PUBLICATIONS

Ikuro Aoki, et al., "80GHz AlGaAs HBT Oscillator" IEEE GaAs IC Symposium Digest, pp. 281–284, 1996.

Primary Examiner—John Guay
Attorney, Agent, or Firm—Oblon, Spivak, McClelland, Maier & Neustadt, P.C.

[57] ABSTRACT

The present invention provides a microwave integrated circuit device in which a sufficiently large gain can be obtained even in a high-frequency region by effectively reducing a ground inductance of a transistor. The device includes both a semiconductor substrate on which a bipolar transistor is formed and a microstrip line formed on the semiconductor substrate. The microstrip line is constituted of a grounded conductive layer, which is electrically connected to both ends of a base electrode, and input and output signal lines connected to emitter and collector electrodes of the transistor, respectively.

14 Claims, 5 Drawing Sheets

MICROWAVE INTEGRATED CIRCUIT DEVICE

BACKGROUND OF THE INVENTION

The present invention relates to a microwave integrated device and, more specifically, to a microwave integrated circuit device of a monolithic structure in which a transistor amplifier and a transmission line are formed on a single semiconductor substrate.

In a microwave integrated circuit (MIC) used in a microwave band and a millimeter wave band, especially in a monolithic microwave integrated circuit (MMIC) wherein a bipolar transistor is used for an active device and both a transistor amplifier and a transmission line are formed on a single semiconductor substrate, the transmission line is generally constituted of a microstrip line and a coplanar line.

FIG. 1 is a plan view of the arrangement of a prior art MMIC using a microstrip line.

As illustrated in FIG. 1, a multi-emitter transistor having a collector region 103, a base region 104 and an emitter region 105 is formed, as a bipolar transistor 102, on a semiconductor substrate (e.g., GaAs substrate) 101.

The transistor 102 serves as a base-grounded amplifier, and its emitter electrode is connected to an input signal line 108, and its collector electrode is connected to an output signal line 109.

Base electrodes of the transistor 102 are connected in common by a drawing line 110, and both ends of the line 110 are connected to a grounded conductive layer (not shown) formed on the undersurface of the semiconductor substrate 101 through via holes 111 and 112, respectively.

Since, in the arrangement of the prior art MMIC, a line extending from the base electrode and the grounded conductive layer is long, a parasitic inductor (hereinafter referred to as a ground inductor) L is formed on the line between the base electrode and grounded conductive layer (GND).

The value of ground inductor L is generally small and thus causes no specific problem in a frequency region of several gigahertz (GHz). In a high-frequency region of 10 odd gigahertz (GHz), however, the gain of the transistor 102 will be decreased.

If, in particular, the transistor 102 is constituted as a multi-emitter one, as shown in FIG. 1, with a view to increasing in output, the transistor 102 is expanded up and down in FIG. 1, or in a direction perpendicular to a transmission direction of a signal which flows from the emitter electrode to the collector electrode and thus the drawing line 110 is lengthened. By the multi-emitter, a low impedance of the transistor will be brought in addition to an increase in the value of ground inductor L, and thus susceptible to the ground inductor; therefore, the gain of the transistor is greatly lowered.

If a coplanar line is used as a transmission line in place of the microstrip line, the base electrode is connected to a ground conductor provided outside a transistor region on the semiconductor substrate without using any via holes. In this case, too, the problem of the decrease in gain occurs and if, in particular, the transistor is formed as a multi-emitter one, the problem becomes more serious.

In the foregoing prior art MMIC using a microstrip line or a coplanar line as a transmission line, the gain of the transistor is lowered by the ground inductor of the transistor in a high-frequency region of 10 odd megahertz (MHz). If, in particular, the transistor is constituted as a multi-emitter one to increase in output, its gain is greatly decreased, and thus the multi-emitter transistor cannot be taken advantage of.

BRIEF SUMMARY OF THE INVENTION

Accordingly, it is an object of the present invention to provide a microwave integrated circuit device wherein an adequate gain is obtained even in a high-frequency region by effectively decreasing the ground inductance of a transistor.

To attain the above object, the present invention is based on that a grounded conductive layer, an insulation layer, and a microstrip line of a signal line are formed on which semiconductor substrate a transistor is formed, and a grounded electrode is connected to the grounded conductive layer on the semiconductor substrate.

According to a first aspect of the present invention, there is provided a microwave integrated circuit device comprising:

a semiconductor substrate;

at least one transistor formed on the semiconductor substrate; and a microstrip line formed on one side of the semiconductor substrate on which the transistor is formed, wherein the microstrip line includes:

a grounded conductive layer in which one end of which is connected to a grounded electrode of the transistor;

an input signal line in which one end of which is connected to an input electrode of the transistor;

an output signal line in which one end of which is connected to an output electrode of the transistor; and an insulation layer for isolating the input signal line from the ground conductive layer and for isolating the output signal line from the ground conductive layer.

According to a second aspect of the present invention, the input signal line at least part of which is formed on the insulation layer and the output signal line at least part of which is formed on the insulation layer.

According to a third aspect of the present invention, the insulation layer is formed of polyimide resin.

According to a fourth aspect of the present invention, the transistor is a bipolar transistor.

According to a fifth aspect of the present invention, the semiconductor substrate is a GaAs substrate.

According to a sixth aspect of the present invention, the grounded conductive layer has two grounded-electrode drawing portions, and the two grounded-electrode drawing portions are connected to the grounded electrode at different points.

According to a seventh aspect of the present invention, the grounded electrode is a base electrode of the transistor.

According to an eighth aspect of the present invention, the grounded electrode is a base electrode of the transistor.

According to a ninth aspect of the present invention, the transistor is a multi-emitter transistor.

According to a tenth aspect of the present invention, the grounded conductive layer has a grounded-electrode drawing portion, and the grounded-electrode drawing portion is connected to the grounded electrode.

According to an eleventh aspect of the present invention, the grounded electrode is a base electrode of the transistor.

According to a twelfth aspect of the present invention, the grounded-electrode drawing portion is connected to one end of the grounded electrode alongside the input signal line.

According to a thirteenth aspect of the present invention, the grounded electrode is an emitter electrode of the transistor.

According to a fourteenth aspect of the present invention, the input electrode of the transistor is a base electrode, and the output electrode of the transistor is a collector electrode.

The microwave integrated circuit device of the present invention includes a semiconductor substrate on which at least one transistor is formed and a microstrip line formed on the semiconductor substrate. The microstrip line is constituted of an insulation layer, a grounded conductive layer, and input and output signal lines. The insulation layer is interposed between the grounded conductive layer and the signal lines. The grounded conductive layer is electrically connected to a grounded electrode of the transistor, and the input and output signal lines are connected to input and output electrodes of the transistor, respectively.

The microstrip line can be so constituted that a grounded conductive layer, an insulation layer and input and output signal lines are formed in order on a semiconductor substrate, or may have a so-called reverse strip line structure in which input and output signal lines are formed on a semiconductor substrate, an insulation layer is formed so as to cover the signal lines, and a grounded conductive layer is formed on the insulation layer.

It is desirable that the grounded conductive layer be connected to both ends of the grounded electrode of the transistor, which are located alongside the input and output signal lines, or one end of the grounded electrode located alongside the input signal line.

Favorably, a bipolar transistor is used as the transistor. If the transistor is constituted as a base-grounded amplifier, the base electrode is connected to the grounded conductive layer, the emitter electrode is connected to the input signal line, and the collector electrode is connected to the output signal line.

If the transistor is constituted as an emitter-grounded amplifier, the emitter electrode is connected to the grounded conductive layer, the base electrode is connected to the input signal line, and the collector electrode is connected to the output signal line.

The transistor can be a multi-emitter bipolar transistor. In this case, each of the grounded electrodes of the multi-emitter transistor is directly connected to the grounded conductive layer.

In the microwave integrated circuit device so constituted, the grounded electrode (base electrode in the base-grounded amplifier and emitter electrode in the emitter-grounded amplifier) is directly connected to the grounded conductive layer or a grounded conductive layer with a thin insulation layer inter-posed therebetween. Thus, the line connected between them is greatly decreased in length.

Consequently, the ground inductance of the transistor in the signal line extending to the ground is greatly decreased, and the decrease in gain of the transistor due to the ground inductance can be prevented.

If, furthermore, the grounded conductive layer is connected to the end portions of the grounded electrode of the transistor which are located alongside the input and output signal lines, the ground inductance can be lowered more effectively.

If, in particular, the transistor is constituted as a base-grounded amplifier, the input impedance is lowered; thus, a grounded conductive layer can be connected to only the end portion of the grounded electrode which is located alongside the input signal line and which effectively increases in ground inductance.

If, in the transistor constituted as a multi-emitter one, each of grounded electrodes is connected to the grounded conductive layer at both ends located alongside the input and output signal lines, that region of the grounded electrode which is connected to the grounded conductive layer is increased. Since, therefore, the ground inductance is reduced more effectively, the same gain as that of the single-emitter transistor can be maintained and the power thereof can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A microwave integrated circuit device according to each of embodiments of the present invention, will now be described with reference to the accompanying drawings.
(First Embodiment)

Figure 3A:
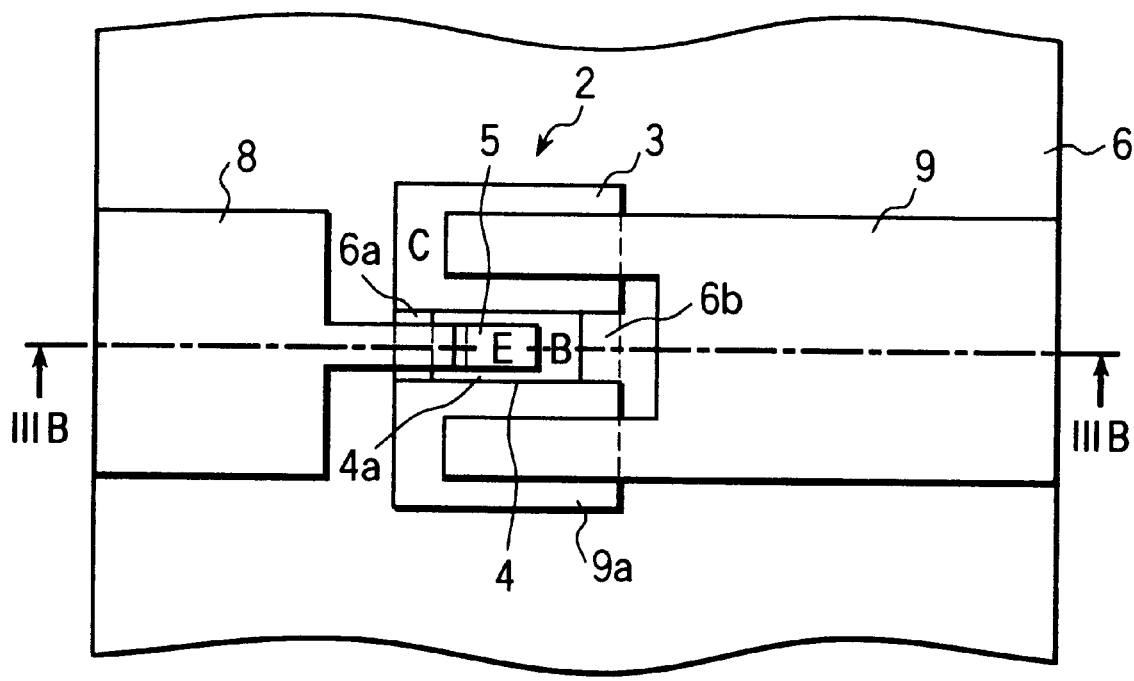
FIG. 3A is a plan view of a microwave integrated circuit device according to a first embodiment of the present invention.
Figure 3B:
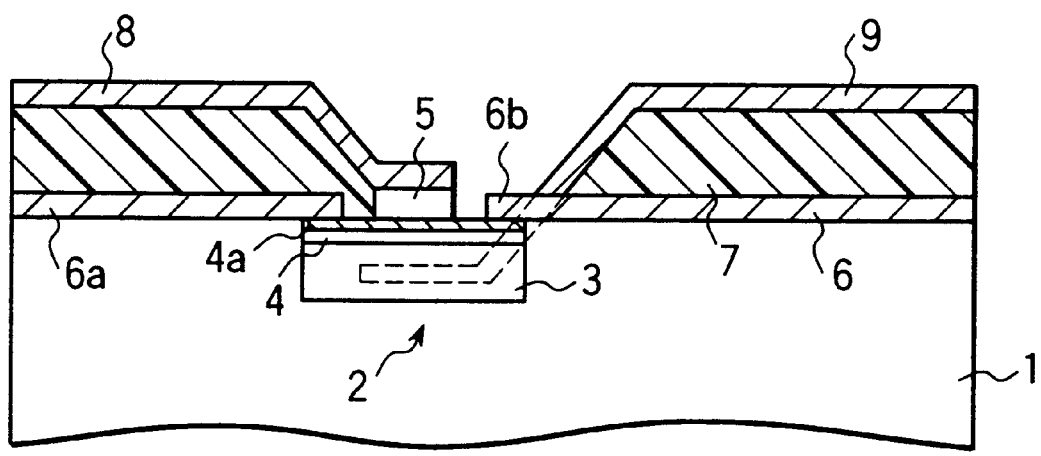
FIG. 3B is a cross-sectional view of the microwave integrated circuit device of FIG. 3A.

FIG. 3A is a plan view of a monolithic microwave integrated circuit (MMIC) device according to a first embodiment of the present invention, while FIG. 3B is a cross-sectional view of the MMIC device of FIG. 3A. In the first embodiment, a bipolar transistor is formed as a base-grounded amplifier.

A semiconductor substrate 1 is, for example, a GaAs substrate which is improved in high-frequency characteristics, and a bipolar transistor 2 having a collector region 3, a base region 4 and an emitter region 5 is formed on the substrate 1.

A grounded conductive layer 6 is formed on the semiconductor substrate 1 except on a transistor forming region, and a thin insulation layer 7 formed of resin such as polyimide resin is formed on the grounded conductive layer 6.

Both an input signal line 8 and an output signal line 9 are formed on the insulation layer 7. The grounded conductive layer 6, insulation layer 7, input signal line 8 and output signal line 9 constitute a microstrip line.

Figure 4:
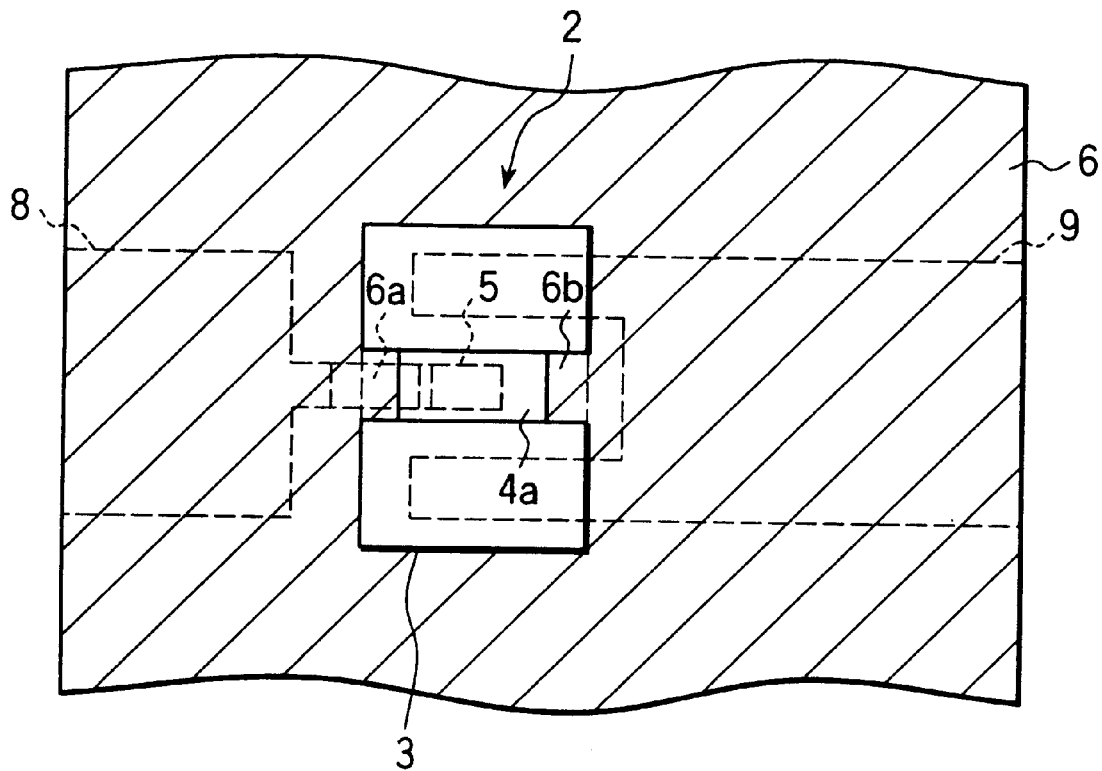
FIG. 4 is a plan view showing a grounded conductive layer of the microwave integrated circuit device of FIG. 3A.

FIG. 4 is a view for explaining the grounded conductive layer 6, in which the shaded portion corresponds to the grounded conductive layer 6.

As is apparent from FIG. 4, the grounded conductive layer 6 includes two base electrode drawing portions 6a and 6b, and these portions 6a and 6b are connected to end portions of the base electrode 4a serving as a grounded electrode, the end portions being located alongside the input and output signal lines 8 and 9, respectively.

Thus, the grounded conductive layer 6 which is provided under a region of the input signal line 8 and which is provided under a region of the output signal line 9 are formed to communicate with each other through the base electrode 4a.

On the other hand, the end of the input signal line 8 is connected to an emitter electrode serving as an input electrode of the transistor 2, while the end of the output signal line 9 is branched into two lines and connected to a collector electrode serving as an output electrode of the transistor 2. The collector region 3 has steps at both ends in the up-and-down direction of FIG. 3B, and two collector electrode drawing portions 9a of the output signal line 9 are connected to the electrodes of the steps.

According to the first embodiment described above, the value of the ground inductor of the transistor 2 can greatly be decreased, and thus the high gain of the transistor 2 can be maintained even in a high-frequency region. This effect will be described in detail.

Figure 5:
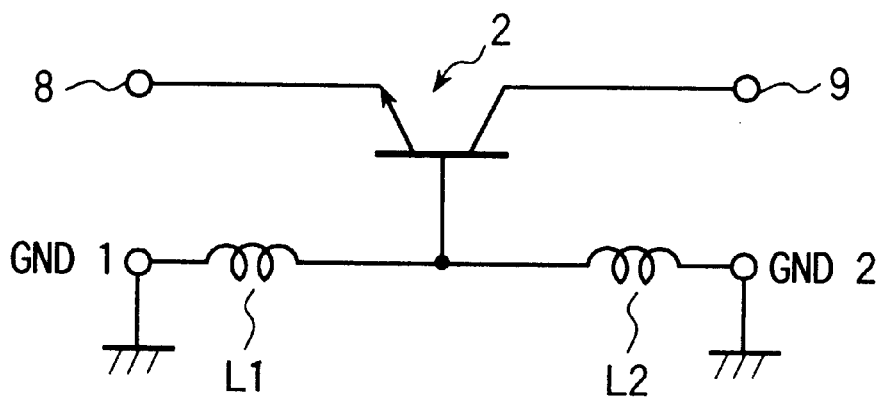
FIG. 5 is a circuit diagram equivalent to the device shown in FIG. 3A which is directed to a parasitic inductor of a transistor.

FIG. 5 illustrates an equivalent circuit of the above MMIC device which is directed to a parasitic inductor of the transistor 2. In the first embodiment, the ground inductor between the base electrode of the transistor 2 and the ground, can be considered to be two inductors: an inductor L1 between the base electrode and the potential GND1 of the grounded conductive layer 6 alongside the input signal line 8 and an inductor L2 between the base electrode and the potential GND2 thereof alongside the output signal line 9.

According to the first embodiment, as described above, the base electrode 4a is directly connected to the base electrode drawing portions 6a and 6b of the grounded conductive layer 6 at both ends alongside the input and output signal lines 8 and 9; therefore, the ground inductors L1 and L2 come to have a very small value.

In other words, there is no phase difference between two routes from a pair of input terminals, connected to the input and output signal lines 8 and 9, to the emitter and base electrodes of the transistor 2, and the ground inductor L1 effectively disappears.

Similarly, there is no phase difference between two routes from the collector and base electrodes of the transistor 2 to a pair of output terminals connected to the output signal line 9 and grounded conductive layer 6, and the ground inductor L2 effectively disappears. Thus, an idealistic characteristic of the transistor 2 can be maintained in a high-frequency region of 10 odd gigahertz (GHz), and the gain is not decreased due to the ground inductor.

(Second Embodiment)

Figure 6:
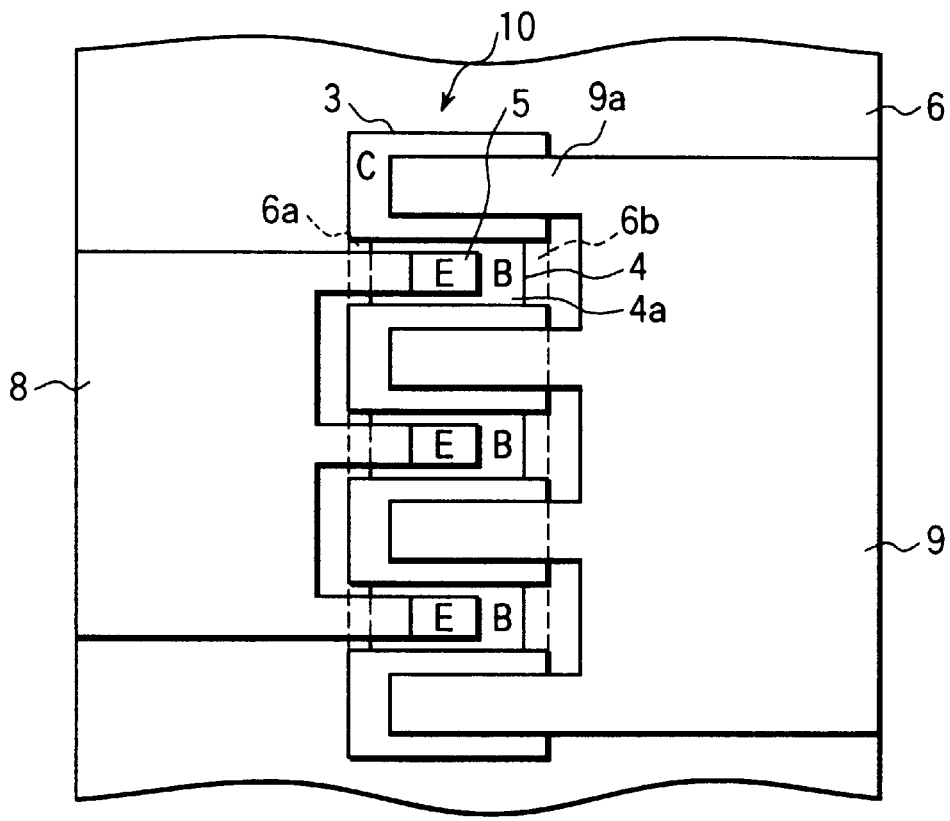
FIG. 6 is a plan view of a microwave integrated circuit device according to a second embodiment of the present invention.

FIG. 6 is a plan view of an MMIC according to a second embodiment of the present invention. The second embodiment is basically the same as the first embodiment, except that a multi-emitter transistor 10 is used in place of a single emitter transistor.

In the second embodiment, the base electrodes 4a of the multi-emitter transistor 10 are directly connected to both ends of a ground conductive layer 9 alongside input and output signal lines 8 an 9.

Figure 1:
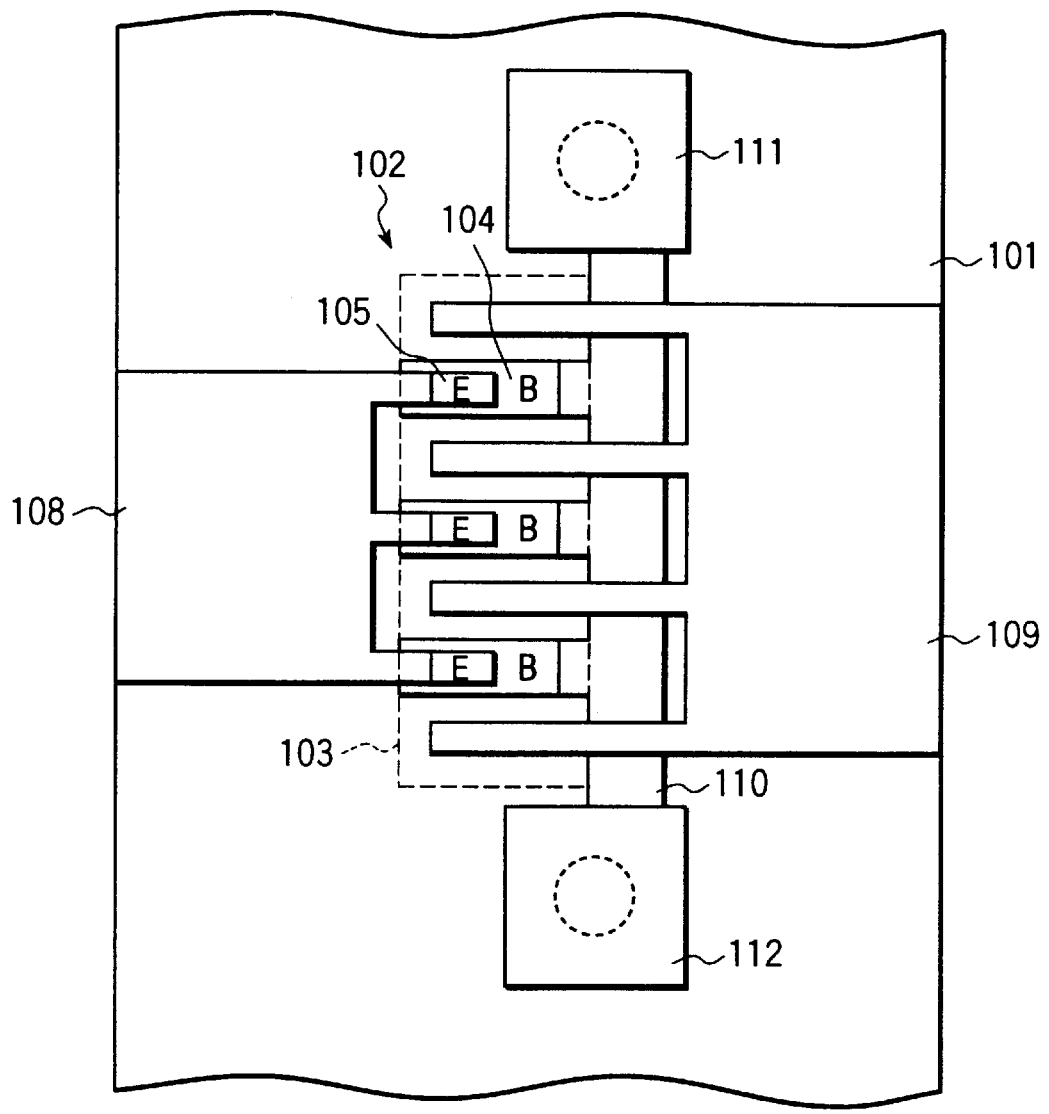
FIG. 1 is a plan view of a prior art microwave integrated circuit device using a microstrip line.
Figure 2:
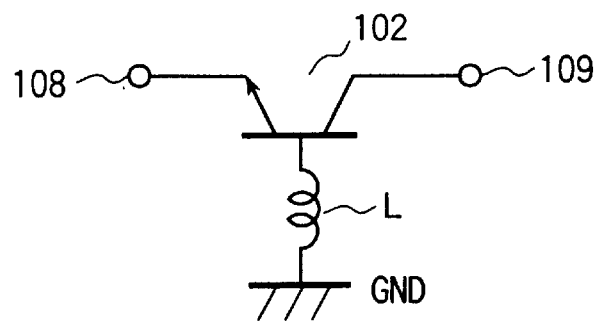
FIG. 2 is a circuit diagram equivalent to the device shown in FIG. 1 which is directed to a parasitic inductor of a transistor.

In the prior art MMIC employing a multi-emitter transistor, as shown in FIG. 1, a line is drawn from each of the base electrodes to the ground conductive layer 9 in a direction perpendicular to a signal transmission direction of the signal which flows from emitter electrode to collector electrode. The larger the number of emitters, the greater the distance by which the line is drawn, thereby increasing in ground inductance.

In contrast, in the second embodiment, since each base electrode 4a of the multi-emitter transistor 10 is connected to the ground conductive layer 6 by the shortest distance, the length of a line required for grounding is not increased. On the contrary, each base electrode 4a is connected to both ends of the ground conductive layer 6 alongside the input and output signal lines 8 and 9 and thus a region connected to the layer 6 is increased.

For this reason, as the impedance of the transistor 10 lowers, the ground inductance decreases. Consequently, the output of the multi-emitter transistor can be increased while keeping the same gain as that of the single-emitter transistor.

(Third Embodiment)

Figure 7:
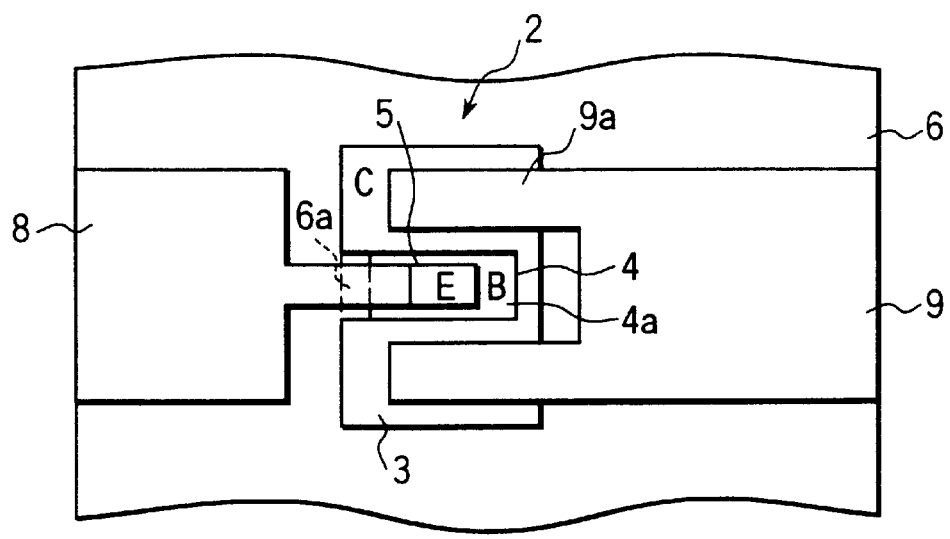
FIG. 7 is a plan view of a microwave integrated circuit device according to a third embodiment of the present invention.

FIG. 7 is a plan view of an MMIC according to a third embodiment of the present invention. The third embodiment differs from the first embodiment in that only one end portion of a base electrode 4a, which is located alongside an input signal line 8, is connected to a grounded conductive layer 6.

If the base of a transistor 2 is grounded, the input impedance of the transistor is low but the output impedance thereof is high. Therefore, even in this arrangement, the values of ground inductors L1 and L2 as shown in FIG. 5 can sufficiently be decreased, and the gain of the transistor can hardly be decreased even in a high-frequency region.

(Fourth Embodiment)

Figure 8A:
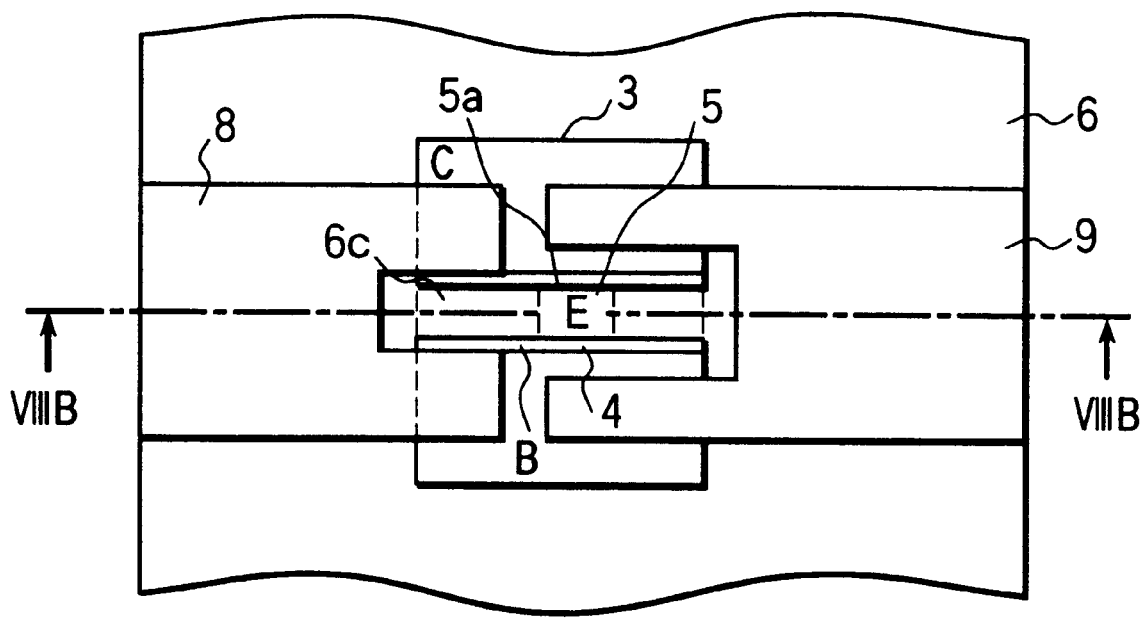
FIG. 8A is a plan view of a microwave integrated circuit device according to a fourth embodiment of the present invention.
Figure 8B:
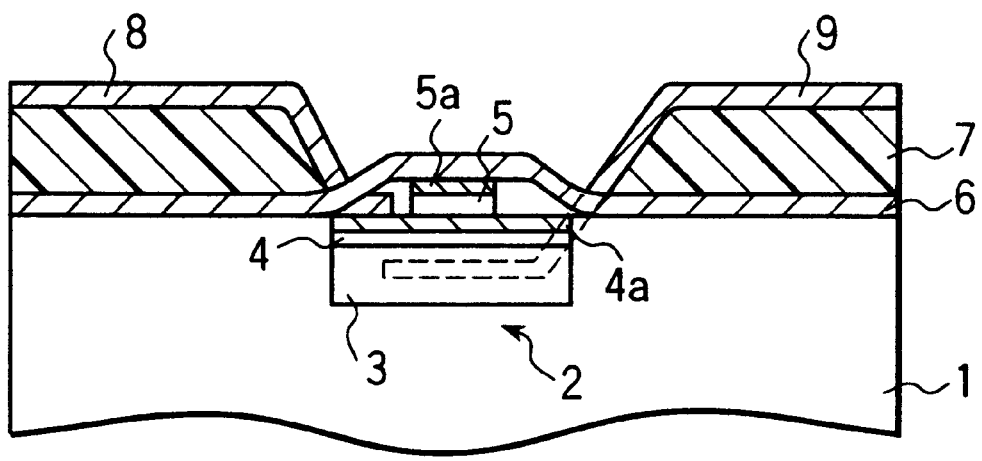
FIG. 8B is a cross-sectional view of a microwave integrated circuit device of FIG. 8A.

FIG. 8A is a plan view of an MMIC according to a fourth embodiment of the present invention, and FIG. 8B is a cross-sectional view of the MMIC shown in FIG. 8A.

In the fourth embodiment, a bipolar transistor 2 is constituted as an emitter-grounded amplifier, and an input signal line 8 is connected to a base electrode 4a of an input electrode, while an output signal line 9 is connected to a collector electrode of an output electrode.

A grounded conductive layer 6 is connected to an emitter electrode 5a of a grounded electrode. An emitter electrode drawing portion 6c of the grounded conductive layer 6 is formed so as to cover the emitter electrode 5a.

In the fourth embodiment, too, the emitter electrode 5a is directly connected to an emitter electrode drawing portion 6a of the grounded conductive layer 6. Therefore, as in the transistor constituted as a base-grounded amplifier, the value of the ground inductor can be restricted to a small value, and the decrease in gain due to the ground inductor can be avoided.

In the foregoing embodiments, a microstrip line has been described wherein the grounded conductive layer 6, insulation layer 7, input signal line 8 and output signal line 9 are formed in this order on the semiconductor substrate 1. However, a so-called reverse microstrip line structure can be adopted wherein input and output signal lines are formed on a semiconductor substrate and then a grounded conductive layer is formed thereon with an insulation layer interposed therebetween.

In the reverse microstrip line structure, the line drawn from the grounded electrode of the transistor to the grounded electrode thereof is longer than that in the above embodiments by the thickness of the insulation layer, but the insulation layer is formed of a thin film and considerably smaller than the thickness of the semiconductor substrate. Thus, as in the above embodiments, the value of the ground inductor can be restricted to a small value.

Furthermore, the value of the ground inductor can be reduced by connecting the grounded conductive layer to at least one end of the grounded electrode of the transistor, which is located alongside the input signal line.

As described above, in the MMIC of the present invention, a grounded conductive layer and a microstrip line constituted of an insulation layer and signal lines, are formed on which semiconductor substrate a transistor is formed, and a grounded electrode of the transistor is connected to a grounded conductive layer directly or with a thin insulation layer interposed between. Since, therefore, the line drawn from the grounded electrode to the grounded electrode is very short and the value of the ground inductor is very small, the decrease in gain of the transistor due to the ground inductor can be prevented and good characteristics can be obtained even in a high-frequency region of 10 odd gigahertz (GHz).

If the grounded conductive layer is connected to one end portion of the grounded electrode of the transistor, which is located alongside the input or output signal line and, in particular, if they are connected alongside at least the input signal line, the ground inductance can be lowered more effectively.

If, in a multi-emitter transistor, each grounded electrode is connected to the grounded conductive layer at both ends located alongside the input and output signal lines, a region of the grounded electrode connected to the grounded conductive layer is increased. Therefore, the ground inductance can be reduced more effectively, with the result that the same gain as that of the single-emitter transistor can be maintained and the power thereof can be increased.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A microwave integrated circuit device comprising:
   a semiconductor substrate;
   a transistor formed on said semiconductor substrate, the transistor having a grounded electrode, an input electrode, and an output electrode;
   an input signal line having one end connected to the input electrode;
   an output signal line having one end connected to the output electrode;
   a grounded conductive layer formed on a same side of the semiconductor substrate as the transistor is formed, said grounded conductive layer having a first portion which is connected to a first portion of the grounded electrode at an input signal line side and a second portion which is connected to a second portion of the grounded electrode at an output signal line side, a same signal flowing through the first and second portions of the grounded conductive layer; and
   an insulation layer for isolating said input signal line from said grounded conductive layer and for isolating said output signal line from said grounded conductive layer.

2. The microwave integrated circuit device according to claim 1, wherein
   said input signal line at least part of which is formed on said insulation layer and said output signal line at least part of which is formed on said insulation layer.

3. The microwave integrated circuit device according to claim 1, wherein said insulation layer is formed of polyimide resin.

4. The microwave integrated circuit device according to claim 1, wherein said transistor is a bipolar transistor.

5. The microwave integrated circuit device according to claim 1, wherein said semiconductor substrate is a GaAs substrate.

6. The microwave integrated circuit device according to claim 1, wherein said grounded electrode is a base electrode of said transistor.

7. The microwave integrated circuit device according to claim 1, wherein said transistor is a multi-emitter transistor.

8. The microwave integrated circuit device according to claim 1, wherein said grounded electrode is an emitter electrode of said transistor.

9. The microwave integrated circuit device according to claim 8, wherein the input electrode of said transistor is a base electrode, and the output electrode of said transistor is a collector electrode.

10. A microwave integrated circuit device comprising:
    a semiconductor substrate;
    a transistor formed on the semiconductor substrate, the transistor having a base electrode, an emitter electrode, and a collector electrode;
    an input signal line having one end connected to the emitter electrode;
    an output signal line having one end connected to the collector electrode;
    a grounded conductive layer formed on a same side of the semiconductor substrate as the transistor is formed, said grounded conductive layer having a first portion connected to a first portion of the base electrode, at an input signal line side and a second portion connected to a second portion of the base electrode at an output signal line side, a same signal flowing through the first and second portions of the grounded conductive layer via the base electrode; and
    an insulation layer for isolating said input signal line from said grounded conductive layer and for isolating said output signal line from said grounded conductive layer.

11. The device according to claim 10, wherein said insulation layer is formed of polyimide resin.

12. The device according to claim 10, wherein said transistor is a bipolar transistor.

13. The device according to claim 10, wherein said semiconductor substrate is a GaAs substrate.

14. A microwave integrated circuit device comprising:
    a semiconductor substrate;
    a transistor formed on said semiconductor substrate, the transistor having a base electrode, an emitter electrode, and a collector electrode;

an input signal line having one end connected to the emitter electrode;

an output signal line having one end connected to the collector electrode;

a first grounded conductive layer formed on a same side of the semiconductor substrate as the transistor is formed, the first grounded conductive layer being connected to a first portion of the base electrode at an input signal line side;

a second grounded conductive layer formed on a same side of the semiconductor substrate as the transistor is formed, said second grounded conductive layer receiving a signal transmitted from the first grounded conductive layer via the base electrode, the second grounded conductive layer being connected to a second portion of the base electrode at an output signal line side; and an insulation layer for isolating said input signal line from said first conductive layer and for isolating said output signal line from said second conductive layer.

* * * * *